US007719926B2

(12) United States Patent
Brogan et al.

(10) Patent No.: US 7,719,926 B2
(45) Date of Patent: May 18, 2010

(54) SLOTTED CYLINDER ACOUSTIC TRANSDUCER

(75) Inventors: Patrick M. Brogan, Bristol, RI (US); Frank V. Costanzo, Westport, MA (US); William J. Marshall, Middletown, RI (US); Dino Roberti, North Kingstown, RI (US)

(73) Assignee: Raytheon Company, Waltham, MA (US)

( * ) Notice: Subject to any disclaimer, the term of this patent is extended or adjusted under 35 U.S.C. 154(b) by 26 days.

(21) Appl. No.: 12/057,709

(22) Filed: Mar. 28, 2008

(65) Prior Publication Data

US 2009/0245027 A1 Oct. 1, 2009

(51) Int. Cl.
*H04R 17/00* (2006.01)
*H01L 41/08* (2006.01)

(52) U.S. Cl. ....................... 367/159; 367/162; 367/163; 367/165; 310/337; 310/369

(58) Field of Classification Search ................. 367/162, 367/163, 159, 165; 310/334, 337, 369
See application file for complete search history.

(56) References Cited

U.S. PATENT DOCUMENTS

| | | | | |
|---|---|---|---|---|
| 4,435,794 | A | 3/1984 | Marshall, Jr. et al. | |
| 4,651,044 | A | 3/1987 | Kompanek | |
| 4,774,427 | A * | 9/1988 | Plambeck | 310/369 |
| 5,103,130 | A | 4/1992 | Rolt et al. | |
| 5,229,978 | A | 7/1993 | Flanagan et al. | |
| 6,002,649 | A * | 12/1999 | Janus | 367/162 |
| 6,069,845 | A | 5/2000 | Ambs | |
| 6,285,631 | B1 | 9/2001 | Benjamin | |
| 6,678,213 | B1 | 1/2004 | Rask et al. | |
| 6,781,288 | B2 | 8/2004 | Osborn | |
| 2006/0056275 | A1 * | 3/2006 | Deangelis et al. | 367/163 |
| 2008/0219101 | A1 * | 9/2008 | Osborn et al. | 367/159 |

* cited by examiner

*Primary Examiner*—Ian J Lobo
(74) *Attorney, Agent, or Firm*—Daly, Crowley, Mofford & Durkee, LLP

(57) ABSTRACT

A slotted cylinder acoustic transducer has a crescent-shaped insert disposed between a ceramic stack assembly and s cylindrical housing shell. In some embodiments, all of the ceramic elements in the ceramic stack assembly can have the same shape.

19 Claims, 5 Drawing Sheets

SLOTTED CYLINDER ACOUSTIC TRANSDUCER

FIELD OF THE INVENTION

This invention relates generally to underwater acoustic transducers and, more particularly, to a slotted cylinder acoustic transducer.

BACKGROUND OF THE INVENTION

A variety of types of conventional acoustic transducers are known. Acoustic transducers are used to convert electrical energy to acoustical energy, and vice-versa. An acoustic projector, a type of acoustic transducer, in operation, is used in one transduction direction, to convert electrical energy to acoustic energy. However, though usually not used in the opposite direction, an acoustic projector also does operate in the opposite direction, to convert acoustic energy into electrical energy.

Some conventional acoustic transducers have limitations. For example, many types of conventional acoustic transducers are not capable of producing large amounts of acoustic power at low frequencies, for example, on the order of two kHz or less, and, in particular, under 400 Hz. Similarly, many types of conventional acoustic transducers are unable to operate over a wide bandwidth at the low frequencies.

Physical limitations can complicate solving such deficiencies. For example, an ability to withstand high stresses is important for deep depth, high water pressure, survival and operation, as well as for the ability to produce high acoustic power levels. An ability to withstand high stresses can result in an inability to operate at the above-described low frequencies.

Known types of acoustic projectors that can operate as acoustic projectors at low frequencies include flextensional transducers, inverse flextensional transducers, bender disc transducers, wall-driven oval transducers (also know as “WALDOs”), and slotted cylinder acoustic transducers.

Slotted cylinder acoustic projectors can be characterized by various parameters, including, but not limited to, a center operating frequency, a bandwidth (associated with a mechanical Q), and an efficiency corresponding to a ratio of acoustic power output to electrical power input.

Referring to FIG. 1, one type of conventional slotted cylinder acoustic transducer 10, here shown as a cross section, includes a cylindrical housing shell 12 having an inner surface 12*a*, an outer surface 12*b*, and a central major axis of curvature 14 (perpendicular to the page). The cylindrical housing shell 12 has a tapered thickness 12*c* between the inner surface 12*a* and the outer surface 12*b*, wherein the thickness 12*c* is taken in a direction perpendicular to the central major axis of curvature 14. The cylindrical housing shell 12 also has a slot 16 through the housing shell 14 extending in a direction parallel to the central major axis of curvature 14, forming a gap 18 in the cylindrical housing shell 12. The thickness 12*c* of the cylindrical housing shell 12 is greatest at a position opposite the slot 16 and smallest at positions proximate to the slot 16.

The slotted cylinder acoustic transducer 10 also includes a plurality of ceramic elements 20, of which a ceramic element 20*a* is but one example, having different solid shapes, and each having a respective central major axis (e.g., 32, perpendicular to the page). It will be recognized that the shapes of the ceramic elements 20 symmetrically on either side of and equidistant from an axis 22 can be the same. However, it will be recognized that there are approximately as many different shapes of ceramic elements 20 as half of a total number of ceramic elements 20.

The slotted cylinder acoustic transducer 10 also includes a plurality of electrodes 24, of which an electrode 24*a* is but one example, having different planar shapes. Each electrode 24 is disposed between two adjacent ceramic elements 20. It will be recognized that the shapes of the electrodes 24 symmetrically on either side of and equidistant from an axis 22 can be the same. However, it will be recognized that there are approximately as many different shapes of electrodes 24 as half of a total number of electrodes.

The plurality of ceramic elements 20 and the plurality of electrodes 24 are interposed in a ceramic stack assembly 26, one of the electrodes 24 between each two adjacent ceramic elements 20. The ceramic stack assembly 26 has an inner surface 26*a*, an outer surface 26*b*, a central major axis of curvature 14*a* (perpendicular to the page) parallel to the central major axis of curvature 14 of the cylindrical housing shell, and tapered thickness 26*c* between the inner surface 26*a* and the outer surface 26*b*, wherein the thickness 26*c* is in a direction perpendicular to the central major axis of curvature 14*a* of the ceramic stack assembly 26. The central major axis of curvature 14*a* of the ceramic stack assembly 26 can be at the same position as the central major axis of curvature 14 of the cylindrical housing shell 26, or it can be at a different position as shown.

A shape of the outer surface 26*b* of the ceramic stack assembly 26 matches a shape of the inner surface 12*a* of the cylindrical housing shell 12. The outer surface 26*b* of the ceramic stack assembly 26 is disposed proximate to the inner surface 12*a* of the cylindrical housing assembly 12.

The slotted cylinder acoustic transducer 10 can further include first and second tapered inserts 28, 30, respectively. The tapered inserts 28, 30 have inner surfaces 28*a*, 30*a*, respectively, outer surfaces 28*b*, 30*b*, respectively, and central major axes 34, 36, respectively (perpendicular to the page). Shapes of the outer surfaces 28*b*, 30*b* of the first and second tapered inserts 28, 30, respectively, match the shape of the inner surface 12*a* of the cylindrical housing shell 12. The outer surfaces 28*b*, 30*b* of the first and second tapered inserts 28, 30, respectively, are disposed proximate to the inner surface 12*a* of the cylindrical housing shell 12. The first tapered insert 28 is disposed proximate a first end of the ceramic stack assembly 26 and the second tapered insert 30 is disposed proximate to a second end of the ceramic stack assembly 26.

The slotted cylinder acoustic transducer 10 can include end caps (not shown) and an outer boot (not shown) so as to be sealed from the water.

It will be appreciated that having so many different ceramic elements 20 with different shapes and so many electrodes 24 with different shapes tends to make the acoustic transducer 10 expensive.

As described above, the acoustic transducer 10 can be characterized by various parameters, including, but not limited to, a center operating frequency, a bandwidth (associated with a mechanical Q), and an efficiency corresponding to a ratio of acoustic power output to electrical power input.

It will be understood that the center operating frequency of the slotted cylinder acoustic transducer 10 is related to a number of parameters, including, but not limited to, a density, stiffness, and modulus of elasticity of the cylindrical housing shell 12, a density, stiffness, and modulus of elasticity of the ceramic stack assembly 26, and a density, stiffness, and modulus of elasticity of the first and second tapered inserts 28, 30, respectively. As is known, stiffness is related to the modulus of elasticity of a material of an object, a shape of the object, and boundary conditions experienced by the object. A higher modulus of elasticity generally results in a higher operating frequency, and a higher density generally results in a lower operating frequency.

In order to design the slotted cylinder acoustic transducer 10 to achieve a particular center operating frequency, properties of the components, or of the entire slotted cylinder acoustic transducer 10, can be modeled using a finite-element computer model. The finite element model should include a so-called "radiation loading" of the water around the slotted cylinder acoustic transducer 10, which is related to an acoustic impedance. Finite element models can predict both static stresses and dynamic stresses upon elements of the transducer 10. Finite element models can also predict dynamic behavior of the slotted cylinder acoustic transducer 10.

It will be understood that the bandwidth of the slotted cylinder acoustic transducer 10 is related to a ratio of largest and smallest thicknesses 12*c* of the tapered cylindrical housing shell 12 and a ratio of largest and smallest thicknesses 26*c* of the tapered ceramic stack assembly 26 in combination with the tapered inserts 28, 30. In addition, it is known that bandwidth of the slotted cylinder acoustic transducer 10 generally increases when a length of the cylindrical housing shell 12 of the slotted cylinder acoustic transducer 10 is increased relative its outer diameter.

An efficiency of the slotted cylinder acoustic transducer 10 is related to a variety of factors, including, but not limited to, characteristics of a rubber boot surrounding the slotted cylinder acoustic transducer, piezoelectric efficiency of the piezoelectric ceramics 20 (related to a dielectric loss resulting in heating), and losses in bondings associated with the ceramic elements 60.

SUMMARY OF THE INVENTION

The present invention provides a slotted cylinder acoustic projector having a crescent-shaped insert that, in some embodiments, allows ceramic elements and electrodes all to have the same size.

In accordance with one aspect of the present invention, a slotted cylinder acoustic transducer includes a cylindrical housing shell having an inner surface, an outer surface, a central major axis of curvature, and a thickness between the inner surface and the outer surface, wherein the thickness is in a direction perpendicular to the central major axis of curvature. The cylindrical housing shell also includes a slot through the cylindrical housing shell extending in a direction parallel to the central major axis of curvature and forming a gap in the cylindrical housing shell. The slotted cylinder acoustic transducer also includes a crescent-shaped insert having an inner surface, an outer surface, a central major axis of curvature parallel to the central major axis of curvature of the cylindrical housing shell, and a tapered thickness between the inner surface and the outer surface. The thickness of the crescent-shaped insert is in a direction perpendicular to the central major axis of curvature. A shape of the outer surface of the crescent-shaped insert matches a shape of the inner surface of the cylindrical housing shell, and the outer surface of the crescent-shaped insert is disposed proximate to the inner surface of the cylindrical housing shell. The thickness of the crescent-shaped insert is greatest at a position opposite the slot. The slotted cylinder acoustic transducer also includes a plurality of piezoelectric ceramic elements, each having a respective solid shape, and each having a respective central major axis parallel to the central major axis of curvature of the cylindrical housing shell. The slotted cylinder acoustic transducer also includes a plurality of electrodes, each having a planar shape. The plurality of piezoelectric ceramic elements and the plurality of electrodes are interposed in a ceramic stack assembly. An electrode is between each two adjacent piezoelectric ceramic elements. The ceramic stack assembly has an inner surface, an outer surface, a central major axis of curvature parallel to the central major axis of curvature of the cylindrical housing shell, and a thickness between the inner surface and the outer surface. The thickness of the ceramic stack assembly is in a direction perpendicular to the central major axis of curvature. A shape of the outer surface of the ceramic stack assembly matches a shape of the inner surface of the crescent-shaped insert, and the outer surface of the ceramic stack assembly is disposed proximate to the inner surface of the crescent-shaped insert.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Before describing the present invention, some introductory concepts and terminology are explained. As used herein, the term "central major axis of curvature" is used to describe an axis about which a solid object or surface curves. As used herein, the term "central major axis" is used to describe an axis passing through at least two centroids of at least two respective cross sections of a solid object. As used herein, the term "about the same as" is used to describe value within twenty percent of another value.

Figure 2:
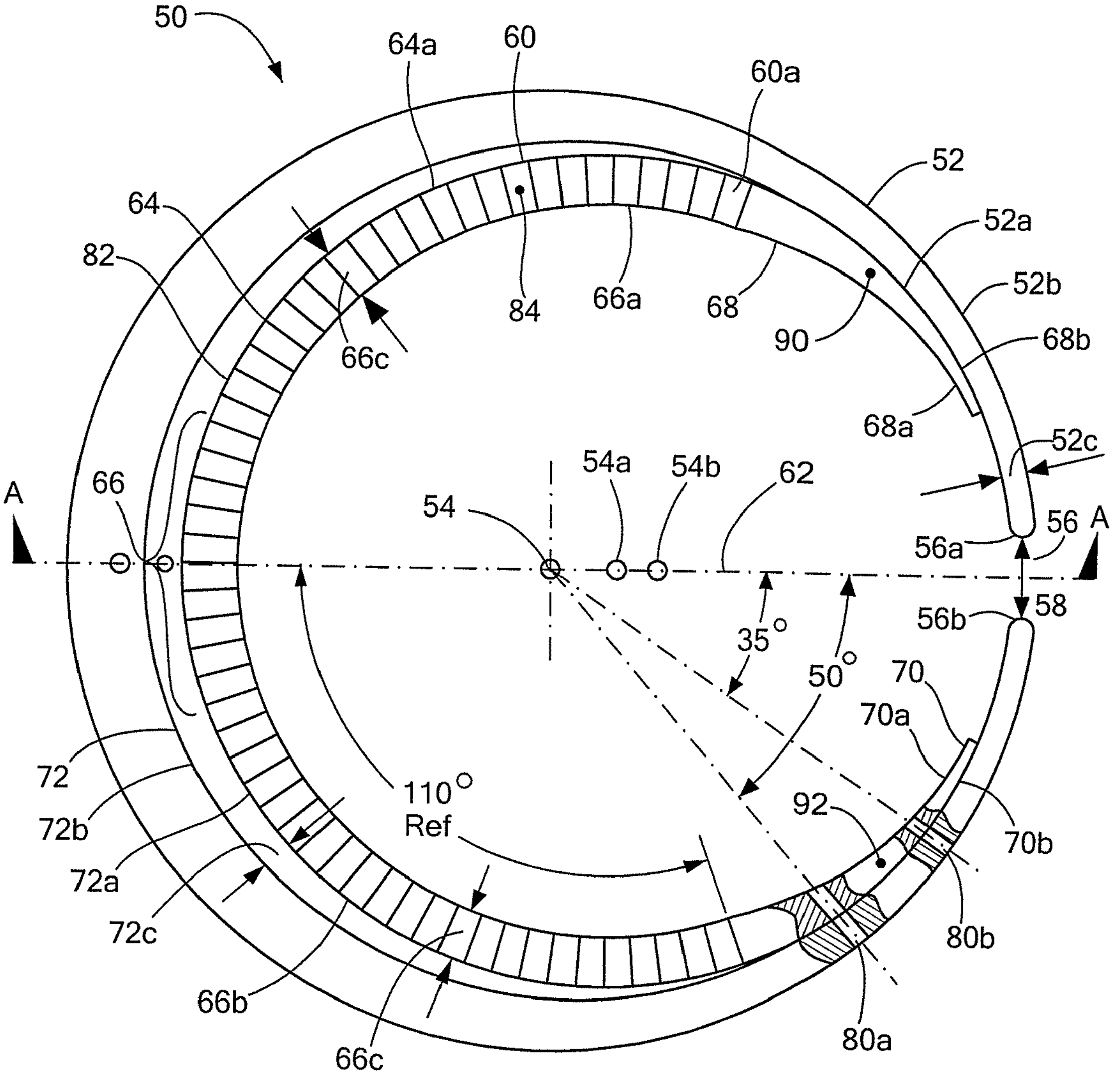
FIG. 2 is a cross-sectional view showing a slotted cylinder acoustic projector in accordance with the present invention.

Referring now to FIG. 2, a slotted cylinder acoustic transducer 50, here shown as a cross section, includes a cylindrical housing shell 52 having an inner surface 52*a*, an outer surface 52*b*, and a central major axis of curvature 54 (perpendicular to the page). The cylindrical housing shell 52 has a thickness 52*c* between the inner surface 52*a* and the outer surface 52*b*, wherein the thickness 52*c* is taken in a direction perpendicular to the central major axis of curvature 54. The cylindrical housing shell 52 also has a slot 56 with first and second slot surface 56*a*, 56*b*, respectively, through the housing shell 54 extending in a direction parallel to the central major axis of curvature 54 and forming a gap 58 in the cylindrical housing shell 52.

The slotted cylinder acoustic transducer 50 also includes a crescent-shaped insert 72 having an inner surface 72*a*, an outer surface 72*b*, a central major axis of curvature 54*a* parallel to the central major axis of curvature 54 of the cylindrical housing shell 52, and a tapered thickness 72*c* between the inner surface 72*a* and the outer surface 72*b*. The thickness 72*c* of the crescent-shaped insert 72 is in a direction perpendicular to the central major axis of curvature 54*a*. A shape of the outer surface 72*b* of the crescent-shaped insert 72 matches a shape of the inner surface 52*a* of the cylindrical housing shell 52. The outer surface 72*b* of the crescent-shaped insert 72 is disposed proximate to the inner surface 52*a* of the cylindrical housing shell 52. The thickness 72*c* of the crescent-shaped insert 72 is greatest at a position opposite the slot 56.

The slotted cylinder acoustic transducer 50 also includes a plurality of piezoelectric ceramic elements 60, of which a piezoelectric ceramic element 60*a* is but one example. In some embodiments, such as the embodiment shown, and unlike the piezoelectric ceramic elements 20 of FIG. 1, each one of the piezoelectric ceramic elements 60 has the same solid shape. However, in other embodiments, like the piezoelectric elements 20 of FIG. 1, the piezoelectric elements 60 have different solid shapes. Each one of the piezoelectric ceramic elements 60 has a respective central major axis (e.g., 84, perpendicular to the page).

The slotted cylinder acoustic transducer 50 also includes a plurality of electrodes 64, of which an electrode 64*a* is but one example. In some embodiments, and unlike the electrodes 24 of FIG. 1, each one of the electrodes 64 has the same planar shape. However, in other embodiments, like the electrodes 24 of FIG. 1, the electrodes 64 have different solid shapes.

The plurality of piezoelectric ceramic elements 60 and the plurality of electrodes 64 are interposed in a ceramic stack assembly 66, one of the electrodes 64 between each two adjacent piezoelectric ceramic elements 60. The ceramic stack assembly 66 has an inner surface 66*a*, an outer surface 66*b*, and a central major axis of curvature 54*b* (perpendicular to the page) parallel to the central major axis of curvature 54 of the cylindrical housing shell 52.

The central major axis of curvature 54*b* of the ceramic stack assembly 66 can be at the same position as the central major axis of curvature 54 of the cylindrical housing shell 52, or it can be at a different position as shown. The central major axis of curvature 54*a* of the crescent-shaped insert 72 can be at the same position as the central major axis of curvature 54 of the cylindrical housing shell 52, or it can be at a different position as shown.

A shape of the outer surface 66*b* of the ceramic stack assembly 66 matches a shape of the inner surface 72*a* of the crescent-shaped insert 72. The outer surface 66*b* of the ceramic stack assembly 66 is disposed proximate to the inner surface 72*a* of the crescent-shaped insert 72.

In some embodiments, a material of the cylindrical housing shell 52 comprises a graphite-epoxy material. However, in other embodiments, the cylindrical housing shell 52 can be comprised of Aluminum, an Aluminum alloy, steel, or an Iron alloy.

Figure 1:
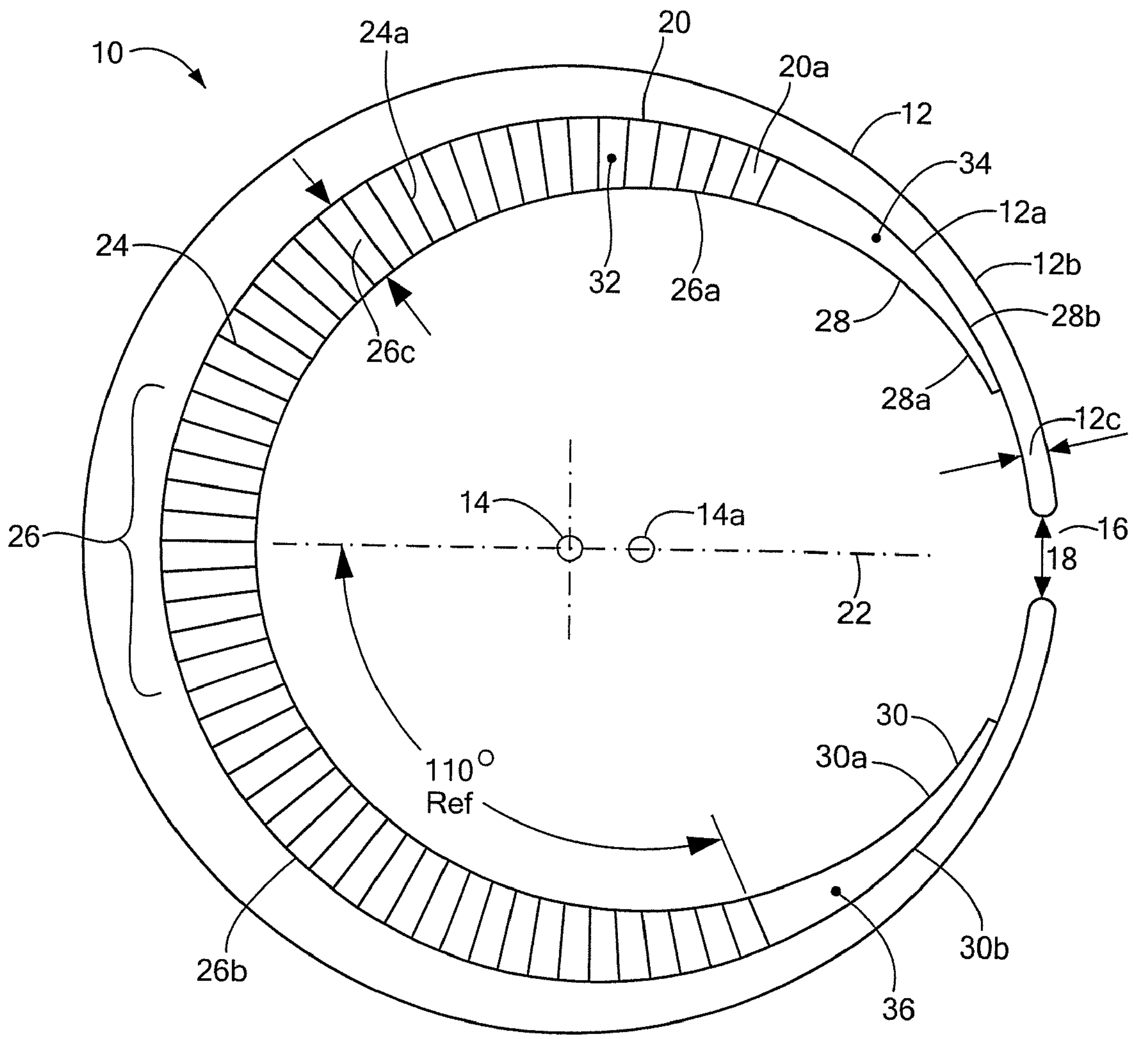
FIG. 1 PRIOR ART
FIG. 1 is a cross-sectional view showing a prior art slotted cylinder acoustic projector.

In some embodiments, such as the embodiment shown, the cylindrical housing shell 52 is the same as or similar to the cylindrical housing shell 12 of FIG. 1. Therefore, in some embodiments, the thickness 52*c* of the cylindrical housing shell 52 is tapered, and the thickness 52*c* of the cylindrical housing shell 52 is greatest at a position opposite the slot 56 and smallest at positions proximate to the slot 56. However, in other embodiments, the thickness 52*c* of the cylindrical housing shell 52 is constant.

In some embodiments, a material of the crescent-shaped insert 72 has a density and a modulus of elasticity about the same as (or otherwise similar to) a density and a modulus of elasticity of a material of the plurality of piezoelectric ceramic elements 60. In some embodiments, a material of the crescent-shaped insert 72 has a density and a modulus of elasticity selected to achieve a predetermined operating frequency. To this end, a stiffer or a denser crescent-shaped insert 72 tends to increase the operating center frequency. Therefore, if a slotted cylinder acoustic transducer 50 is designed and tested and found to have an operating frequency different from that intended, the crescent-shaped insert 72 can be modified to adjust the operating frequency. It is similarly possible to make adjustments to the crescent-shaped insert 72 in order to achieve the desired operating frequency at different depths. The crescent-shaped insert 72 can be made of a material comprising at least one of a graphite-epoxy material, Aluminum, an Aluminum alloy, Copper, a Copper alloy, steel, or an Iron alloy.

In some embodiments, such as the embodiment shown, and unlike the ceramic stack assembly 26 of FIG. 1, the ceramic stack assembly 66 has a constant thickness 66*c* between the inner surface 66*a* and the outer surface 66*b*, wherein the thickness 66*c* is in a direction perpendicular to the central major axis of curvature 54*b* of the ceramic stack assembly 66. However, in other embodiments, like the ceramic stack assembly 26 of FIG. 1, the ceramic stack assembly 66 can have a tapered thickness 66*c*.

In some embodiments, the slotted cylinder acoustic transducer 50 can further include first and second tapered inserts 68, 70, respectively. The tapered inserts 68, 70 have inner surface 68*a*. 70*a*, respectively, outer surfaces 68*b*, 70*b*, respectively, and central major axes 90, 92, respectively (perpendicular to the page). Shapes of the outer surfaces 68*b*, 70*b* of the first and second tapered inserts 68, 70, respectively, match the shape of the inner surface 52*a* of the cylindrical housing shell 52. The outer surfaces 68*b*, 70*b* of the first and second tapered inserts 68, 70, respectively, are disposed proximate to the inner surface 52*a* of the cylindrical housing shell 52. The first tapered insert 68 is disposed proximate a first end of the ceramic stack assembly 66 and the second tapered insert 70 is disposed proximate to a second end of the ceramic stack assembly 66.

In some embodiments, a material of the first and second tapered inserts 68, 70 has a modulus of elasticity about the same as a modulus of elasticity of a material of the plurality of piezoelectric ceramic elements 60. In some embodiments, the material of the first and second tapered inserts 68, 70 has a density about the same as a density of the material of the plurality of piezoelectric ceramic elements 60. In other embodiments, the material of the first and second tapered inserts 68, 70 has a density lower than the density of the material of the plurality of piezoelectric ceramic elements 60.

A plurality of holes 80*a*, 80*b* through the tapered inserts 68, 70 and through the cylindrical housing shell 52 can be used in conjunction with screws, pins, rivets, or the like (not shown) to hold the tapered inserts 68, 70 to the cylindrical housing shell 52.

The crescent-shaped insert 72 can be bonded to the cylindrical housing shell 52 using a two-component epoxy structural adhesive. Similarly, the ceramic stack assembly 66 can be bonded to the crescent-shaped insert 72 with the same or with a different two-component epoxy structural adhesive.

The slotted cylinder acoustic transducer 50 can include end caps (e.g., 102 of FIG. 3A) and an outer boot (e.g., 104 of FIG. 3A) so as to be sealed from the water.

It will be appreciated that embodiments having only one type, i.e., shape, of piezoelectric ceramic elements 60 and one shape of electrodes 64 tends to make the acoustic transducer 50 less expensive than the prior art slotted cylinder acoustic projector 10 of FIG. 1.

The slotted cylinder acoustic transducer 50 can include an insulating layer 82 disposed between the ceramic stack assembly 66 and the crescent-shaped insert. The insulating layer can be comprised of a variety of materials, including, but not limited to, a polyetherimide, for example, ULTEM®, or a polymide, for example, KAPTON®. In some arrangements, the insulating layer 82 can withstand at least ten thousand volts without breakdown. The insulating layer is tailored to be able to withstand at least a maximum operating voltage of the ceramic stack assembly 66.

In some embodiments, a solid shape and a material of the crescent-shaped insert 72 are selected so that a bandwidth and a center frequency of the slotted cylinder acoustic transducer 50 are approximately the same as a bandwidth and a center frequency of a different slotted cylinder acoustic transducer, for example, the slotted cylinder acoustic transducer 10 of FIG. 1, which has no crescent-shaped insert, which has a plurality of different piezoelectric ceramic elements 20, and which has a plurality of different electrodes 24, each different piezoelectric ceramic element 20 and each different electrode 24 differently shaped to achieve a different ceramic stack assembly 26.

In some embodiments, the cross section of the slotted cylinder acoustic transducer 50 taken in a direction perpendicular to the central major axis of curvature 54 of the cylindrical housing shell 52 as shown, has a round inner surface 52*a* of the cylindrical housing shell 52, a round inner surface 72*a* of the crescent-shaped insert 72, and a round inner surface 66*a* of the ceramic stack assembly 66. However, in some embodiments, a cross section of the cylindrical housing shell 52 is elliptical.

In one particular embodiment, a cross section of the cylindrical housing shell 52 has a round outer shape with a diameter of about 7.5 inches, a round inner shape, and is made of a graphite epoxy material. In one particular embodiment, the thickest part of the cylindrical housing shell 52 has a thickness of about 0.60 inches, the thinnest parts of the cylindrical housing shell 52 near the slot 56 have a thickness of about 0.20 inches, and the gap 58 has a dimension of about 0.75 inches. In one particular embodiment, the crescent-shaped insert has a thickest dimension of about 0.30 inches, a thinnest dimension of about zero, and is made from Aluminum. In one particular embodiment, the ceramic stack assembly 66 has a constant thickness of about 0.38 in, the ceramic stack assembly 66 includes 56 ceramic elements 60, each having the same bar shape, and each one of the ceramic elements 60 is made from Navy modified Type 3 ceramic material, which meets DOD standard 1376A, for example, type EC67 made by the EDO Corporation of Salt Lake City, Utah. Other ceramic materials can also be used, for example, Navy Type 4.

As described above, the acoustic transducer 50 can be characterized by various parameters, including, but not limited to, a center operating frequency, a bandwidth (associated with a mechanical Q), and an efficiency corresponding to a ratio of acoustic power output to electrical power input. In one particular embodiment the slotted cylinder acoustic transducer 50 has a center operating frequency of about 474 Hz, a bandwidth of about 96 Hz and an efficiency of about 82 percent when operating at a depth of about four hundred feet.

As described above, it will be understood that the center operating frequency of the slotted cylinder acoustic transducer 50 is related to a number of parameters, including, but not limited to, a density, stiffness, and modulus of elasticity of the cylindrical housing shell 52, a density, stiffness, and modulus of elasticity of the ceramic stack assembly 66, and a density, stiffness, and modulus of elasticity of the first and second tapered inserts 68, 70, respectively. As is known, stiffness is related to the modulus of elasticity of a material of an object, a shape of the object, and boundary conditions experienced by the object. A higher modulus of elasticity generally increases operating frequency, and a higher density generally decreases operating frequency.

As also described above, in order to design the slotted cylinder acoustic transducer 50 to achieve a particular center operating frequency, properties of the components, or of the entire slotted cylinder acoustic transducer, can be modeled using a finite-element computer model. The finite element model should include the radiation loading of the water around the slotted cylinder acoustic transducer 50, which is related to an acoustic impedance. Finite element models can predict both static stresses and dynamic stresses upon elements of the transducer 50.

Finite element models can predict both static stresses and dynamic stresses upon elements of the transducer 10. Finite element models can also predict dynamic behavior of the slotted cylinder acoustic transducer 50.

In addition, it is known that bandwidth of the slotted cylinder acoustic transducer 50 is generally increased when a length of the cylindrical housing shell 52 of the slotted cylinder acoustic transducer 50 is increased relative its outer diameter.

An efficiency of the slotted cylinder acoustic transducer 50 is related to a variety of factors, including, but not limited to, characteristics of a rubber boot (e.g., 102, FIG. 3A), surrounding the slotted cylinder acoustic transducer 50, piezoelectric efficiency of the piezoelectric ceramics 60 (related to a dielectric loss resulting in heating), and losses in bondings associated with the ceramic elements 60.

Figure 3:
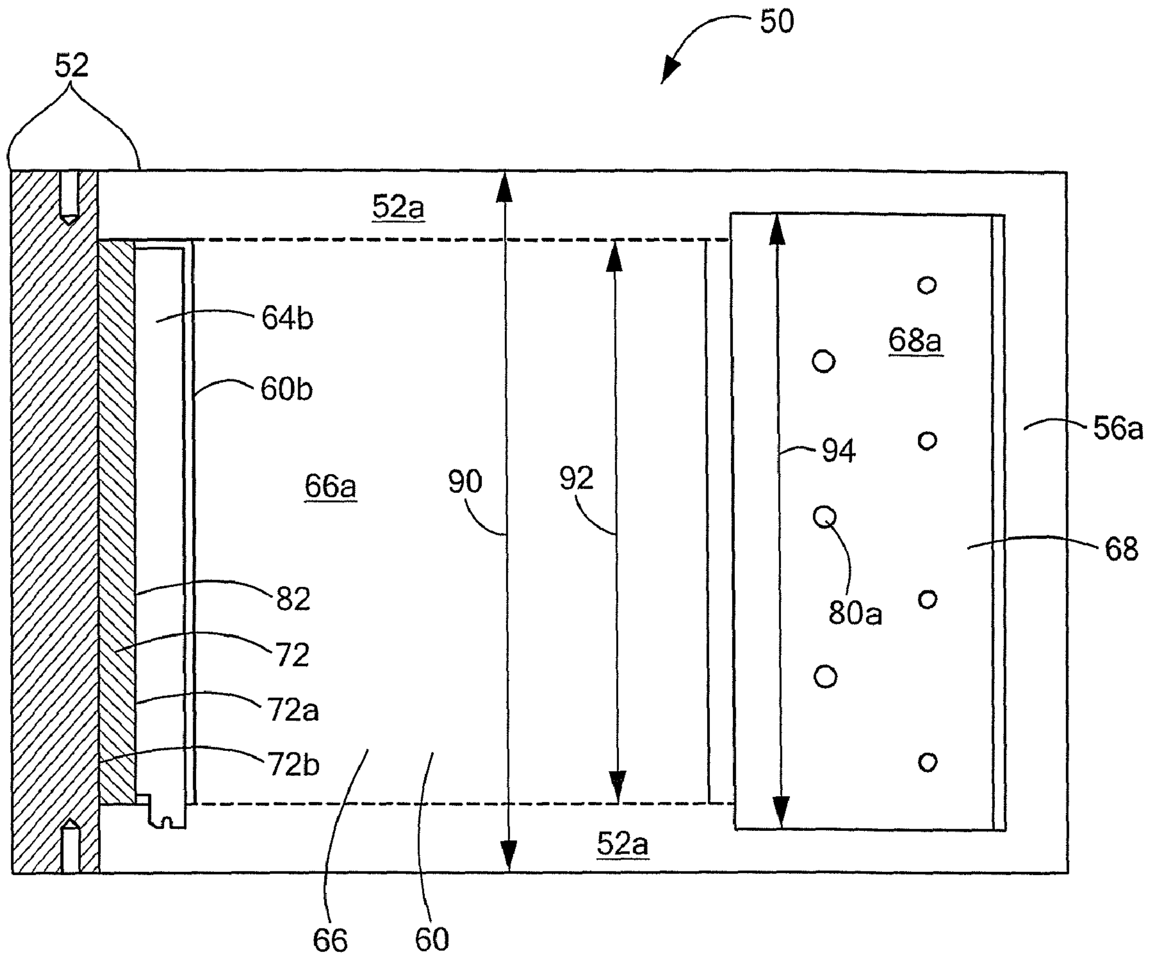
FIG. 3 is a cross-sectional view showing the slotted cylinder acoustic projector of FIG. 2 in another plane.

Referring now to FIG. 3, in which like elements of FIG. 2 are shown having like reference designations, the slotted cylinder acoustic transducer 50, here shown in a side cross-sectional view in accordance with a section line A-A of FIG. 2, includes the cylindrical housing shell 52 and the crescent-shaped insert 72 having the first and second surface 72*a*, 72*b*, respectively. The slotted cylinder acoustic transducer 50 also includes the plurality of ceramic elements 60, forming the ceramic stack assembly 66 having the first surface 66*a*. Only one ceramic element 60*b* and one electrode 64*b* are explicitly shown for clarity.

The slotted cylinder acoustic transducer 50 also includes the tapered insert 68 having the first surface 68*a*. The slotted cylinder acoustic transducer 50 also includes the first surface 56*a* of the gap 56 of FIG. 2, wherein it will be recognized that the gap 58 continues into the page.

A plurality of holes, for example, the above-described hole 80*a* through the tapered insert 68 and through the cylindrical housing shell 52 can be used in conjunction with screws, rivets, or the like (not shown) to hold the tapered inserts 68 to the cylindrical housing shell 52.

In one particular embodiment, a height 92 of the ceramic stack assembly 66 is about four inches, a height 90 of the cylindrical housing shell 52 is about five inches and a height of the tapered insert 68 is about four inches.

Figure 3A:
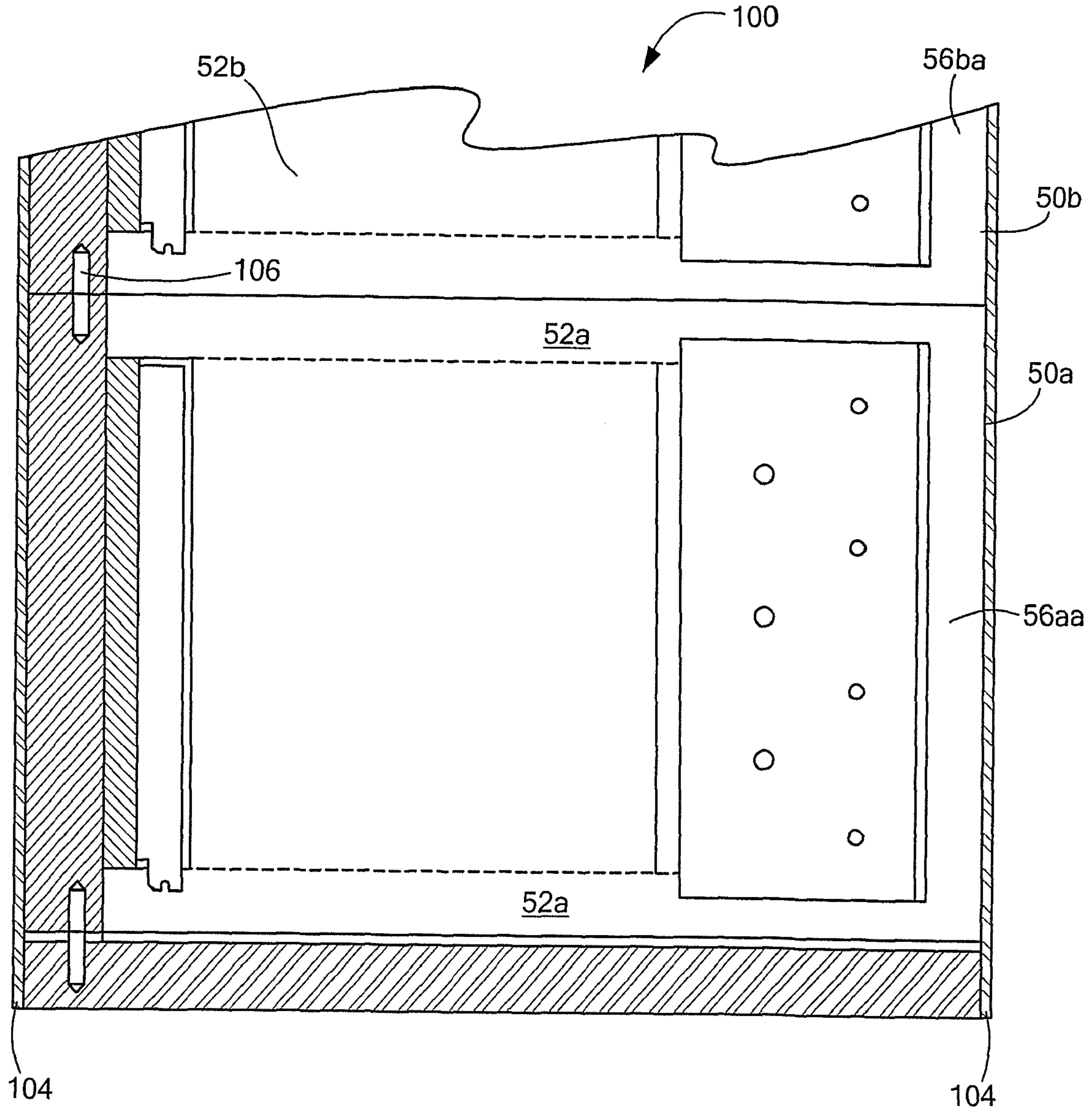
FIG. 3A is a cross-sectional view showing two stacked slotted cylinder acoustic projectors of FIG. 2 in the plane of FIG. 3 and surrounded by end caps and a boot.

Referring now to FIG. 3A, like elements of FIG. 2 are shown having like reference designations, but with an extra letter indicative of an instance of the element. For example, there are two slotted cylinder acoustic transducers 50 (FIG. 2) designated 50*a* and 50*b*.

The two slotted cylinder acoustic transducers 50*a*, 50*b* are coupled or stacked, forming a longer slotted cylinder acoustic transducer 100. When stacked in this way, the term "ceramic/shell assembly" can be used to describe each portion 50*a*, 50*b* and the entire stacked assembly can be referred to as the slotted cylinder acoustic transducer 100. The ceramic/shell assemblies 50*a*, 50*b* can be aligned with a guide pin 106 or the like. The slotted cylinder acoustic transducer 100 can be made water tight with end caps, here only an end cap 102 is shown, and with a boot 104, which can, in some embodiments, be a rubber boot. While two ceramic/shell assemblies 50*a*, 50*b* are shown, it should be recognized that, in other arrangements, there can be one ceramic/shell assembly or more than two ceramic/shell assemblies stacked in a slotted cylinder acoustic transducer having end caps and a boot.

Figure 4:
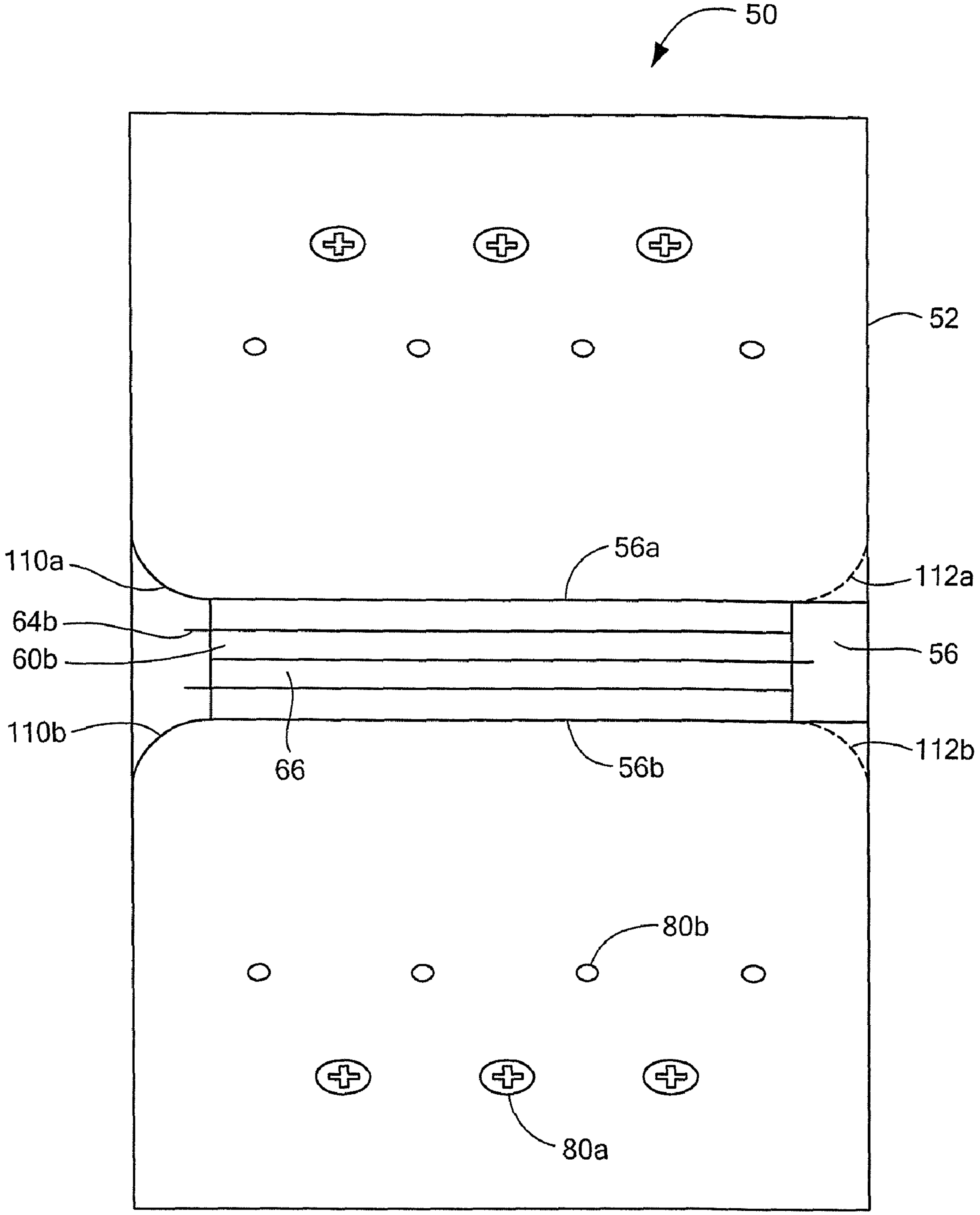
FIG. 4 is a side view of the slotted cylinder acoustic projector of FIG. 2.

Referring now to FIG. 4, in which like elements of FIG. 2 are shown having like reference designations, the slotted cylinder acoustic transducer 50 of FIG. 2 is shown from a view looking into the slot 56. In some embodiments, the slot 56 can have rounded regions, of which rounded regions 110*a*, 110*b* are examples. The rounded regions 110*a*, 110*b* can provide protection of a rubber boot, for example, the rubber boot 104 of FIG. 3A, by eliminating sharp corners that could tear the boot. In other embodiments, the slotted cylinder acoustic transducer 50 can have additional rounded regions 112*a*, 112*b*. However, when the slotted cylinder acoustic transducer 50 is but one of a plurality of stacked ceramic/shell assemblies, in some embodiments, the two end-most ceramic/shell assemblies each have rounded regions only on one end.

All references cited herein are hereby incorporated herein by reference in their entirety.

Having described preferred embodiments of the invention, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A slotted cylinder acoustic transducer, comprising:

a cylindrical housing shell having an inner surface, an outer surface, a central major axis of curvature, a thickness between the inner surface and the outer surface, the thickness in a direction perpendicular to the central major axis of curvature, and a slot through the cylindrical housing shell extending in a direction parallel to the central major axis of curvature and forming a gap in the cylindrical housing shell;

a crescent-shaped insert having an inner surface, an outer surface, a central major axis of curvature parallel to the central major axis of curvature of the cylindrical housing shell, and a tapered thickness between the inner surface and the outer surface, the thickness in a direction perpendicular to the central major axis of curvature, wherein a shape of the outer surface of the crescent-shaped insert matches a shape of the inner surface of the cylindrical housing shell, wherein the outer surface of the crescent-shaped insert is disposed proximate to the inner surface of the cylindrical housing shell, wherein the thickness of the crescent-shaped insert is greatest at a position opposite the slot;

a plurality of piezoelectric ceramic elements, each having a respective solid shape, and each having a respective central major axis parallel to the central major axis of curvature of the cylindrical housing shell; and a plurality of electrodes, each having a planar shape, wherein the plurality of piezoelectric ceramic elements and the plurality of electrodes are interposed in a ceramic stack assembly, an electrode between each two adjacent piezoelectric ceramic elements, the ceramic stack assembly having an inner surface, an outer surface, a central major axis of curvature parallel to the central major axis of curvature of the cylindrical housing shell, and a thickness between the inner surface and the outer surface, the thickness in a direction perpendicular to the central major axis of curvature, wherein a shape of the outer surface of the ceramic stack assembly matches a shape of the inner surface of the crescent-shaped insert, wherein the outer surface of the ceramic stack assembly is disposed proximate to the inner surface of the crescent-shaped insert, wherein each one of the plurality of piezoelectric ceramic elements has the same solid size and shape, and wherein each one of the electrodes has the same planar shape, wherein the ceramic stack assembly has a constant thickness between the inner surface and the outer surface of the ceramic stack assembly, wherein a material of the crescent-shaped insert is selected to have a density and a modulus of elasticity about the same as a density and a modulus of elasticity of a material of the plurality of piezoelectric ceramic elements.

2. The slotted cylinder acoustic transducer of claim 1, wherein the cylindrical housing shell has a tapered thickness between the inner surface and the outer surface of the cylindrical housing shell, and wherein the thickness of the housing shell is greatest at a position opposite the slot and smallest at positions proximate to the slot.

3. The slotted cylinder acoustic transducer of claim 1, wherein a material of the crescent-shaped insert comprises at least one of a graphite-epoxy material, Aluminum, Aluminum alloy, Copper, Copper alloy, steel, or Iron alloy.

4. The slotted cylinder acoustic transducer of claim 1, wherein a material of the crescent-shaped insert has a density and a modulus of elasticity selected to achieve a predetermined operating frequency.

5. The slotted cylinder acoustic transducer of claim 1, further comprising an insulating material disposed between the ceramic stack assembly and the crescent-shaped insert.

6. The slotted cylinder acoustic transducer of claim 5, wherein the insulating material is selected to withstand at least a maximum operating voltage of the ceramic stack assembly.

7. The slotted cylinder acoustic transducer of claim 5, wherein the insulating material is comprised of at least one of a polyetherimide or a polymide.

8. The slotted cylinder acoustic transducer of claim 1, wherein a cross section of the slotted cylinder acoustic transducer taken in a direction perpendicular to the central major axis of curvature of the cylindrical housing shell has a round inner surface of the cylindrical housing shell, a round inner surface of the crescent-shaped insert, and a round inner surface of the ceramic stack assembly.

9. The slotted cylinder acoustic transducer of claim 1, further comprising first and second tapered inserts, the first and second tapered inserts having respective inner surfaces, respective outer surfaces, and respective central major axes, wherein shapes of the outer surfaces of the first and second tapered inserts match the shape of the inner surface of the cylindrical housing shell, wherein the outer surfaces of the first and second tapered inserts are disposed proximate to the inner surface of the cylindrical housing shell, wherein the first tapered insert is disposed proximate to a first end of the ceramic stack assembly and the second tapered insert is disposed proximate to a second end of the ceramic stack assembly.

10. The slotted cylinder acoustic transducer of claim 9, wherein a material of the first and second tapered inserts comprises at least one of a graphite-epoxy material, Aluminum, Aluminum alloy, Copper, Copper alloy, steel, or Iron alloy.

11. The slotted cylinder acoustic transducer of claim 9, wherein a material of the first and second tapered inserts has a modulus of elasticity about the same as a modulus of elasticity of a material of the plurality of piezoelectric ceramic elements.

12. The slotted cylinder acoustic transducer of claim 1, wherein a material of the cylindrical housing shell comprises a graphite-epoxy material.

13. The slotted cylinder acoustic transducer of claim 1, further comprising first and second end caps at first and second ends of the cylindrical housing shell.

14. The slotted cylinder acoustic transducer of claim 13, further comprising a waterproof boot surrounding the cylindrical housing shell.

15. The slotted cylinder acoustic transducer of claim 1, wherein a solid shape and a material of the crescent-shaped insert are selected so that a bandwidth and a center frequency of the slotted cylinder acoustic transducer are approximately the same as a bandwidth and a center frequency of a different slotted cylinder acoustic transducer having no crescent-shaped insert, the same cylindrical housing shell, a plurality of different piezoelectric ceramic elements, and a plurality of different electrodes, each different piezoelectric ceramic element and each different electrode differently shaped to achieve a different ceramic stack assembly having an outer surface with a shape matching a shape of the inner surface of the cylindrical housing shell, wherein the outer surface of the different ceramic stack assembly is disposed proximate to the inner surface of the cylindrical housing shell.

16. The slotted cylinder acoustic transducer of claim 15, wherein a material of the crescent-shaped insert comprises at least one of a graphite-epoxy material, Aluminum, Aluminum alloy, Copper, Copper alloy, steel, or Iron alloy.

17. The slotted cylinder acoustic transducer of claim 16, further comprising an insulating material disposed between the ceramic stack assembly and the crescent-shaped insert.

18. The slotted cylinder acoustic transducer of claim 17, the insulating material is selected to withstand at least a maximum operating voltage of the ceramic stack assembly.

19. The slotted cylinder acoustic transducer of claim 17, wherein the insulating material is comprised of at least one of a polyetherimide or a polymide.

* * * * *

UNITED STATES PATENT AND TRADEMARK OFFICE

CERTIFICATE OF CORRECTION

PATENT NO. : 7,719,926 B2
APPLICATION NO. : 12/057709
DATED : May 18, 2010
INVENTOR(S) : Patrick Brogan et al.

It is certified that error appears in the above-identified patent and that said Letters Patent is hereby corrected as shown below:

Col. 1, line 14, delete “vice-versa.” and replace with --vice versa.--.

Col. 1, line 39, delete “know” and replace with --known--.

Col. 4, line 53, delete “surface” and replace with --surfaces--.

Col. 6, line 20, delete “surface” and replace with --surfaces--.

Col. 8, line 29, delete “surface” and replace with --surfaces--.

Signed and Sealed this

Fifth Day of October, 2010

David J. Kappos

David J. Kappos
*Director of the United States Patent and Trademark Office*